US012620945B2

(12) United States Patent
Kirk et al.

(10) Patent No.: US 12,620,945 B2
(45) Date of Patent: May 5, 2026

(54) ELECTRICAL CIRCUIT

(71) Applicant: Gottfried Wilhelm Leibniz Universität Hannover, Hannover (DE)

(72) Inventors: Ansgar Kirk, Hannover (DE); Stefan Zimmermann, Burgwedel (DE); Cornelius Wendt, Hannover (DE)

(73) Assignee: Gottfried Wilhelm Leibniz Universität Hannover, Hannover (DE)

( * ) Notice: Subject to any disclaimer, the term of this patent is extended or adjusted under 35 U.S.C. 154(b) by 916 days.

(21) Appl. No.: 17/763,300

(22) PCT Filed: Oct. 9, 2019

(86) PCT No.: PCT/EP2019/077364
§ 371 (c)(1),
(2) Date: Jul. 26, 2022

(87) PCT Pub. No.: WO2021/069071
PCT Pub. Date: Apr. 15, 2021

(65) Prior Publication Data
US 2022/0376660 A1      Nov. 24, 2022

(51) Int. Cl.
*H03F 1/52*          (2006.01)
*H03F 1/26*          (2006.01)
*H03F 3/45*          (2006.01)

(52) U.S. Cl.
CPC ................. *H03F 1/52* (2013.01); *H03F 1/26* (2013.01); *H03F 3/45475* (2013.01);
(Continued)

(58) Field of Classification Search
CPC ........ H03F 1/52; H03F 1/26; H03F 2200/372; H03F 3/45; H03F 3/45475;
(Continued)

(56) References Cited

U.S. PATENT DOCUMENTS

| | | | | |
|---|---|---|---|---|
| 4,044,313 A | * | 8/1977 | Wittlinger | ............... H03F 1/523 330/253 |
| 4,068,278 A | | 1/1978 | Williams | |

(Continued)

FOREIGN PATENT DOCUMENTS

| | | | | |
|---|---|---|---|---|
| CA | 2873626 A1 | * | 12/2013 | ............... H03F 3/70 |
| GB | 2552233 A | * | 1/2018 | ............. H03F 3/087 |

(Continued)

OTHER PUBLICATIONS

Fanzhong et al., Analysis and Design of a High Performance Infrared Detector Readout Circuit, 2009, IEEE (Year: 2009).*

(Continued)

*Primary Examiner* — Andrea Lindgren Baltzell
*Assistant Examiner* — Lance Torbjorn Bartol

(57)          ABSTRACT
The invention relates to an electrical circuit in the form of a transimpedance amplifier stage, and to a method for operating this circuit. The invention furthermore relates to a circuit containing at least one signal amplifier that has at least one output connection, at least one input connection or at least one pair of differential input connections and at least two voltage supply connections, one of which may also be an earth or ground connection, wherein the signal amplifier has at least one additional connection that is connected internally to at least one of the input connections or the input connection via at least one further component, for example a diode.

13 Claims, 5 Drawing Sheets

Figure 1:

(52) U.S. Cl.
CPC .. *H03F 2200/129* (2013.01); *H03F 2200/156* (2013.01); *H03F 2200/372* (2013.01); *H03F 2200/444* (2013.01); *H03F 2203/45114* (2013.01); *H03F 2203/45116* (2013.01); *H03F 2203/45166* (2013.01); *H03F 2203/45514* (2013.01); *H03F 2203/45534* (2013.01)

(58) Field of Classification Search
CPC ..... H03F 2200/129; H03F 2203/45116; H03F 2200/156; H03F 2203/45534; H03F 2200/444; H03F 2203/45158; H03F 2203/45114; H03F 2203/45136; H03F 2203/45166; H03F 1/34
USPC ........................................................ 330/298
See application file for complete search history.

(56) References Cited

U.S. PATENT DOCUMENTS

| | | | |
|---|---|---|---|
| 5,252,928 A | 10/1993 | Giorgetta | |
| 5,281,860 A | 1/1994 | Krenik | |

| | | | | |
|---|---|---|---|---|
| 2011/0031419 A1* | 2/2011 | Fukui | ...................... | H03F 3/087 250/574 |
| 2015/0260813 A1* | 9/2015 | Mandal | ............. | G01R 33/3614 324/322 |
| 2016/0094191 A1* | 3/2016 | Tanaka | ...................... | H03F 3/08 250/214 A |

FOREIGN PATENT DOCUMENTS

| | | | |
|---|---|---|---|
| JP | 09162654 A | * | 6/1997 |
| JP | 3181954 B2 | | 7/2001 |
| WO | 0175455 A2 | | 10/2001 |

OTHER PUBLICATIONS

Meng Fanzhong et al, "Analysis and design of a high performance Infrared detector readout circuit", Integrated Circuits, ISIC '09. Proceedings of The 2009 12th International Symposium on, IEEE, Piscataway, NJ, USA, Dec. 14, 2009 (Dec. 14, 2009), pp. 605-608.

* cited by examiner

ELECTRICAL CIRCUIT

The invention relates to an electrical circuit in the form of a transimpedance amplifier stage as well as to a method for operating this circuit. The invention additionally relates to a circuit with at least one signal amplifier which has at least one output connection, at least one input connection or at least one pair of differential input connections as well as at least two voltage supply connections, one of which can also be an earth or ground connection, wherein the signal amplifier has at least one additional connection which is connected internally via at least one further component, for example a diode, to at least one of the input connections or to the input connection.

In general, the invention relates to the field of circuits for signal amplification of electrical signals. Transimpedance amplifiers (TIA) convert and amplify an input current into an output signal that depends on it, usually in the form of an output voltage. The key parameters of a transimpedance amplifier include the possible dynamic range of the input current, the bandwidth and the input current noise. Since the noise generally increases with the bandwidth, the construction of fast, low-noise transimpedance amplifiers requires a particularly low noise. Transimpedance amplifiers are usually realized in a resistive, logarithmic or more rarely capacitive manner.

Resistive transimpedance amplifiers possess an ohmic resistor as a feedback element. In order to reduce the input current noise, the resistance must be increased. A low-noise, resistive transimpedance amplifier therefore possesses a large feedback resistor, which for a wide dynamic range means that large output voltage amplitudes of several hundred volts must be driven. The resulting complexity in terms of circuitry is, therefore, impractical.

Logarithmic transimpedance amplifiers use a diode or a bipolar transistor as a feedback element and thus compress the output signal. This circumvents the necessity for large output voltage amplitudes. However, the strong temperature dependence of the feedback properties of the semiconductor components and the relatively large leakage currents which limit the input current range downward prove to be disadvantageous in this case.

Capacitive transimpedance amplifiers possess a capacitor as a feedback element. The output voltage corresponds to the integral of the input current over time. Owing to the very large insulation resistance of the capacitor, it adds practically no noise, unlike the ohmic resistor of the resistive transimpedance amplifier. At the same time, the output voltage amplitude is limited by the integration duration, eliminating the need for an expensive high-voltage supply for a low-noise transimpedance amplifier. In addition, the temperature dependence is comparatively low in comparison to the logarithmic transimpedance amplifier. The capacitive transimpedance amplifier architecture is therefore best suited for a low-noise amplifier with an extremely high dynamic range with currents from several fA up to several µA. In addition to the properties of the integration capacitor, the reset circuit for discharging the integration capacitor is essential for a high-performance transimpedance amplifier. This should ideally not affect the input path of the transimpedance amplifier.

Leakage currents also flow through open switching elements and are often highly temperature dependent. Consequently, they cannot be compensated trivially and therefore substantially reduce the input current range. Charge injection results from parasitic capacitances in the switching element which switch charge to the input path when opening or closing the switching element and thus cause parasitic input currents and may even possibly saturate the integration capacitor. In addition, closed switching elements have a resistance greater than zero and, as a result of this, hinder the current flow and thus rapid discharge.

Since relays are very inert, semiconductor-based analog switches which, however, have higher leakage currents, are generally used as switching elements. Switching elements today additionally all have charge injection. For these reasons, they cannot be used as a switching element for resetting the integration capacitor for input currents below 100 fA, which is why existing capacitive transimpedance amplifier designs have comparatively poor performance data.

A circuit with a capacitive transimpedance amplifier is known from U.S. Pat. No. 9,324,546 B2.

The underlying object of the invention is to specify an electrical circuit in the form of a transimpedance amplifier stage with improved operational data and a method for operating a circuit of this type. Furthermore, an improved circuit with at least one signal amplifier of the type mentioned at the outset shall be specified.

This object is achieved by an electrical circuit in the form of a transimpedance amplifier stage, wherein the circuit has an input node, an output node and a feedback node, with the following features:

a) at least one signal amplifier which has at least one output connection and at least one input connection or at least one pair of differential input connections, wherein an input signal applied to at least one input connection is converted into a multiple amplified output signal emitted at the output connection, wherein the output connection is connected or can be connected to the output node directly or via at least one further component and at least one of the input connections is connected or can be connected to the input node directly or via at least one further component, wherein, in the case of an individual input connection, the reference potential of the signal amplifier or, in the case of a pair of differential input connections, the potential of the other input connection which is not connected or cannot be connected to the input node is referred to as a first reference potential, b) at least one feedback element which is connected or can be connected to the input node with a first connection directly or via at least one further component and to the feedback node with a second connection directly or via at least one further component, c) at least one feedback control element which is connected or can be connected to the feedback node with a first connection directly or via at least one further component and to the output node with a second connection directly or via at least one further component, d) at least one first switch through which the feedback node can be connected to a second reference potential directly or via at least one further component, e) at least one second switch through which the output node can be connected to the input node directly or via at least one further component.

The circuit according to the invention has the advantage that a capacitive or at least partially capacitive transimpedance amplifier architecture can be provided in which a very efficient resetting of the feedback element, for example discharging the feedback capacitor, is possible via the existing switches. In this case, the circuit has practically no interference influences as a result of leakage currents of the existing switches. It is additionally possible to achieve a high switching speed of the existing switches with low charge injection at the same time. This is made possible by the fact that the feedback element is not short-circuited via the non-ideal switching element as in previous circuits, but rather the voltage across the feedback element is actively regulated to a specific value, for example zero. The circuit permits a feedback capacitor to be discharged actively and extremely rapidly, without significantly affecting the input path.

The electrical circuit is suitable, for example, as a signal amplifier for highly sensitive measuring devices, for example for gas chromatographs, ion mobility spectrometers, mass spectrometers, other types of spectrometers or analyzers for electrical material parameters.

The signal amplifier usually has a high amplification factor, for example at least 1000 or at least 10000. The signal amplifier can be designed as an operational amplifier, for example, advantageously as an electrometer amplifier with low leakage currents.

In this case, the first reference potential can be a fixed (unchangeable) voltage potential, in particular also the earth potential of the circuit. Alternatively, a changeable potential could also be used in order to change the properties of the circuit during operation.

Furthermore, the object is also achieved by an electrical circuit in the form of a transimpedance amplifier stage, wherein the circuit has an input node and an output node, with the following features:

a) at least one signal amplifier which has at least one output connection and at least one input connection or at least one pair of differential input connections, wherein an input signal applied to at least one input connection is converted into a multiple amplified output signal emitted at the output connection, wherein the output connection is connected or can be connected to the output node directly or via at least one further component and at least one of the input connections is connected or can be connected to the input node directly or via at least one further component, wherein, in the case of an individual input connection, the reference potential of the signal amplifier or, in the case of a pair of differential input connections, the potential of the other input connection which is not connected or cannot be connected to the input node is referred to as a first reference potential, b) at least one feedback element which is connected or can be connected to the input node with a first connection directly or via at least one further component and to the output node with a second connection directly or via at least one further component, c) at least one further signal amplifier which has at least one further output connection and at least one further input connection or at least one further pair of differential input connections, wherein an input signal applied to at least one further input connection is converted into a multiple amplified output signal emitted at the further output connection, wherein the further output connection is connected to a second switch directly or via at least one further component and at least one further input connection is connected to the output node in such a way directly or via at least one further component, wherein, in the case of an individual further input connection, the reference potential of the further signal amplifier or, in the case of a further pair of differential input connections, the potential of the other further input connection which is not connected or cannot be connected to the output node is referred to as a second reference potential, d) at least the second switch through which the further output connection can be connected to the input node directly or via at least one further component.

In this way, the second signal amplifier can adopt the regulation according to the invention through which the feedback element is reset to the neutral state, without the first or second connection of the feedback element having to be directly connected to one another (short-circuited) for this purpose. Instead, the further signal amplifier is switched between the output node and the second switch.

The second reference potential can be a potential which is disconnected from the first reference potential or a (short-circuited) potential which is connected to the first reference potential. In this case, these elements represent only the basic framework of the circuit. For example, additional signal amplifiers or multiple inversions of the signal can be inserted between these elements, without changing the mode of operation of the circuit. The feedback element may have a third connection, for example, which is at any reference potential.

According to one advantageous embodiment of the invention, provision is made for the feedback element to be formed by a resistor, a capacitor or a circuit made up of one or a plurality of resistors and/or one or a plurality of capacitors. This allows a simple realization of the feedback element as well as a particularly effective transimpedance amplifier with high sensitivity. It is advantageous if the feedback element has at least one capacitive part.

According to one advantageous embodiment of the invention, provision is made for the feedback control element to be formed by a resistor, a capacitor or a circuit made up of one or a plurality of resistors and/or one or a plurality of capacitors. This allows a simple realization of the feedback control element as well as a particularly effective transimpedance amplifier with high sensitivity. In particular, it is advantageous to design the feedback control element in such a way that it improves the frequency response of the transimpedance amplifier stage generated by the feedback element. This means that an undesired low-pass effect of the feedback element can be compensated by the feedback control element, for example.

Via the first switch, the feedback node can thus optionally, i.e. if the first switch is set to a specific switch position, be connected to the second reference potential and can be disconnected from the second reference potential in a different switch position. The first switch can be designed as a simple on/off switch, for example. The fact that the feedback node can in this case be connected to the output connection of the signal amplifier via the feedback control element does not influence the circuit, provided that the impedance of the feedback control element is high compared to the impedance of the closed first switch, for example at least ten times greater.

Through the second switch, the output connection of the signal amplifier can be connected to the input node if the switch is set to a corresponding switch position or can be disconnected from it if the switch is in a different switch position. The second switch can be designed as an on/off switch, for example.

In particular, as a result of the arrangement of the first and the second switch, the circuit according to the invention makes it possible for the feedback element to be rese to a neutral state, for example by setting its first and second connection to practically the same voltage potential, without the first or second connection having to be directly connected to one another (short-circuited) for this purpose.

The first and the second switch can in particular be switches which can be controlled by electrical control signals. The switches can have galvanic switch contacts, semiconductor switches, signal amplifiers with an output which can be switched off and/or signal amplifiers with an input hysteresis. The first and/or second switch can be designed as an analog switch, for example. Analog switches of this type allow reliable and rapid switching. However, depending on the embodiment, additional interference effects may be generated as a result, for example through leakage current and/or charge injection of the analog switch.

According to one advantageous embodiment of the invention, provision is made for the second reference potential to correspond to the first reference potential. In this way, resetting the feedback element, for example discharging the capacitor, can take place quickly and at the same time without affecting the input path. This is because in the case of the circuit according to the invention, it is not necessary to directly bridge the feedback element via a switch and to short-circuit it accordingly. Instead, the functionality of the signal amplifier can be used which, owing to its high amplification factor, tends to keep the potential difference between its input connection and the first reference potential low and therefore to keep it practically at the same potential. As a result, voltage drops at the switches and further components located in the discharge path are also compensated which would otherwise affect the discharge. In this way, the first and the second connection of the feedback element are virtually short-circuited, so to speak, since the first and the second connection can be brought to the same voltage potential as a result of the first and the second switch.

It is also possible to use a different voltage potential as a second reference potential than a first reference potential. The feedback element, for example a capacitor, can then be precharged to a predefined voltage which corresponds to the difference between these voltage potentials.

According to one advantageous embodiment of the invention, provision is made for at least one current limiting element to be connected in series to the second switch which has a current transfer characteristic through which small currents, in particular leakage currents of the second switch, are prohibited from passing and larger voltages are allowed to pass. In other words, practically no current flows when the voltage applied is small, but in the case of a larger voltage, a current flows which is larger by far more than the ratio of these voltages. The current limiting element can, for example, be a diode or a circuit made up of diodes, for example two diodes connected in antiparallel, or a corresponding circuit made up of JFETs (JFET—Junction Field Effect Transistor). As a result, possible interference effects of the first and/or second switch, for example leakage current and/or charge injection, can be further minimized.

The mentioned parts of the circuit can be designed as separate components in each case, i.e. as discrete components. In particular, the feedback element, the feedback control element, the current limiting element, the first switch and the second switch can be designed as components which are separate from the signal amplifier.

According to one advantageous embodiment of the invention, provision is made for the current limiting element to be formed by protection diodes integrated in the signal amplifier. The advantage of this is that no additional components are required for forming the current limiting element. One further particularly substantial advantage for a transimpedance amplifier stage with high sensitivity is that by using integrated protection diodes which are already present in the signal amplifier, the input path of the circuit is not affected in any way by the current limiting element or the remaining parts which are connected to the first switch and/or the second switch. It is then merely the input of the signal amplifier and the first connection of the feedback element that are to be connected to the input node.

According to one advantageous embodiment of the invention, provision is made for the first and the second switch to be able to be controlled by electrical control signals, wherein the circuit has a control device for controlling the switching of the first and the second switch, wherein the control device is set up, in a first operation mode, to switch the first and the second switch into switch positions through which a current flowing into the input node is converted into an amplified, integrated or otherwise dependent output signal at the output node of the circuit and, in a second operation mode, to switch the first and the second switch into switch positions through which the circuit, in particular the feedback element, is actively regulated to a neutral state. The control device therefore emits the electrical control signals to the first and the second switch, in order to selectively activate the first operation mode or the second operation mode.

Accordingly, the control device can switch the first and the second switch from the first operation mode to the second operation mode, etc. at regular or irregular intervals, for example in a fixed cycle in the millisecond range, if this is specified externally, if the last change of the operation mode was a specific time ago or if the output voltage of the signal amplifier exceeds a specific threshold value. As a result, the circuit, in particular the feedback element is reset to the neutral state at specific times. Capacitive parts of the feedback element can in this way be discharged rapidly. It is advantageous if the second operation mode is only activated for a relatively short time, so that the circuit is operated in the predominant time periods in the first operation mode in which, by means of the transimpedance amplifier stage, the input signals are detected and can be emitted as amplified output signals and measurements can be carried out accordingly. The duty cycle with which the second operation mode is activated can thus be at 10% or less, for example. The control device can be designed in terms of hardware as a clock generator, for example, as a configurable hardware, such as FPGA or CPLD, or it can be a microprocessor controlled device which runs a computer program through which the electrical control signals for controlling the first and the second switch are generated and output.

In particular, an external control signal can be used to reset the transimpedance amplifier in a targeted manner, for example during a time period in which interferences are expected as a result of switching processes.

According to one advantageous embodiment of the invention, provision is made for the control device to be set up to switch the first and the second switch in the same direction. If the first and the second switch are designed as on/off switches in each case, the second switch is therefore always in the "on" state when the first switch is in the "on state", and the second switch is in the "off" state when the first switch is in the "off" state.

According to one further advantageous embodiment, the feedback control element is designed as a third switch which is switched by the control device in the opposite direction to the first switch. The first and third switch can therefore advantageously be implemented by one individual changeover switch, which takes over their switching function, instead of by two on/off switches.

The object mentioned at the outset is also achieved by a method for operating a circuit of the type mentioned previously in which the feedback element is reset by actively regulating the voltage across the feedback element to a specific value, for example zero. The feedback element is therefore not short-circuited as in previous circuits via a non-ideal switching element, but rather is actively regulated, for example by means of the signal amplifier.

According to one advantageous embodiment of the invention, provision is made, in a first operation mode of the circuit, for a current flowing into the input node to be converted into an amplified, integrated or otherwise dependent output signal at the output node of the circuit and, in a second operation mode of the circuit, for the circuit, in particular the feedback element, to be actively regulated to a neutral state, wherein the first and the second operation mode are switched between. The first operation mode is therefore a working mode of the circuit, the second operation mode a reset operation mode of the circuit.

In particular, if the first signal amplifier is not unity-gain-stable, it may be advantageous to insert an additional compensation network in the circuit path with the second switch or to give the second signal amplifier a special frequency response, so that it is ensured that the noise gain of the circuit is sufficiently high in both cases for stable operation of the first signal amplifier.

According to one advantageous embodiment of the invention, provision is made for the output node to be coupled with a differentiator. In this way, a final output signal can be provided which is adjusted for an optionally present integrating influence of the feedback element, for example, if it has a capacitance. The differentiator can be designed in analog technology, for example, i.e. as an analog differentiator. The differentiator can also be realized digitally, for example with an analog-to-digital converter and a computer, microcontroller or FPGA connected to the analog-to-digital converter, on which the differentiation is carried out through digital calculation steps. In this case, common filter circuits for limiting the signal bandwidth are advantageously connected between the transimpedance amplifier stage and analog-to-digital converter. The differentiation differentiates the signal received from the output connection of the signal amplifier according to time. The digitized signal can advantageously also be evaluated for triggering the control device.

In one further advantageous embodiment, the frequency of the reset signal generated when a specific output voltage is exceeded can also be evaluated, in order to determine the average current that flowed during this time period.

The object mentioned at the outset is also achieved by a circuit with at least one signal amplifier which has at least one output connection, at least one input connection or at least one pair of differential input connections as well as at least two voltage supply connections, one of which can also be an earth or ground connection, wherein the signal amplifier has at least one additional connection which is connected internally via at least one further component, for example a diode, to at least one of the input connections or to the input connection, wherein the circuit has at least one component which is connected to this connection and through which an electrical current is fed into this connection or an electrical voltage is applied to this connection. In particular, connections can also be used in this case which are actually configured as an output for a signal, which is clear to the person skilled in the art. The component mentioned previously can, for example, be a further signal amplifier or a line connected to a specific potential.

This additional connection can be a so called guard connection, for example, which is normally used to insulate input connections from leakage currents on or through a printed circuit board or die on which the signal amplifier is arranged. In addition, this provides ESD protection. The signal amplifier can have a guard circuit, for example, in which a pair of diodes connected in antiparallel are connected between the guard connection and positive input connection and/or a pair of diodes connected in antiparallel are connected between the guard connection and the negative input connection. In the signal amplifier, the guard connection can also be connected to further components, for example to a guard buffer. According to the invention, it has now been established that a signal amplifier with a guard connection of this type can also be applied elsewhere, for example in order to eliminate components which would otherwise be necessary for external wiring of the signal amplifier and to replace them with parts of the guard circuit of the signal amplifier.

In the example described previously of the transimpedance amplifier stage, two diodes connected in antiparallel can be used for reducing leakage current interference effects of the analog switches, for example. These externally connected diodes can be dispensed with by using a corresponding part of the guard circuit inside the signal amplifier, as explained in greater detail hereinafter by means of an exemplary embodiment.

The invention is explained in greater detail hereinafter by means of exemplary embodiments using drawings. In the drawings FIG. 1—shows a first embodiment of an electrical circuit and FIGS. 2, 3—show a second embodiment of an electrical circuit in a first and a second operation mode and FIGS. 4, 5—show a third embodiment of an electrical circuit in a first and a second operation mode and FIG. 6—shows a fourth embodiment of an electrical circuit and FIG. 7—shows a fifth embodiment of an electrical circuit and FIG. 8—shows a sixth embodiment of an electrical circuit.

The circuits represented in FIGS. 1 to 8 are represented by way of example as a transimpedance amplifier stage in each case. Other embodiments are also possible.

FIG. 1 shows the circuit with a signal amplifier V1, a feedback element RE, a first switch S1 and a second switch S2. The signal amplifier V1 has a negative input connection 1, a positive input connection 2 and an output connection 3. The first switch S1 and the second switch S2 are represented as on/off switches by way of example. They each have two switch positions. In one switch position, a contact C is connected to a contact A of the respective switch S1, S2, in another switch position, the switches are open.

At the input node IN, an input signal which is to be measured is fed in, in this case an input current $I_{IN}$. The input node IN is connected to the negative input connection 1, a first connection of the feedback element RE and the contact C of the second switch S2. The positive input connection 2 is connected to a fixed voltage potential, the first reference potential REF1, for example earth potential.

The output connection 3 is connected to the output node at which the output signal $U_{OUT}$ is provided. This is further connected to the contact A of the second switch S2 and first connection of the feedback control element RSE. The second connection of the feedback element RE, the second connection of the feedback control element RSE and the contact A of the first switch S1 are connected to the feedback node FB. The contact C of the first switch S1 is connected to a second reference potential REF2, for example to the earth potential.

In the adjacent box, different exemplary embodiments of the feedback control element are shown, for example a resistor R1, a network N1 as well as an on/off switch S3.

The circuit is in a first operation mode in which the normal measurement and amplification function of the transimpedance amplifier stage can be carried out.

Figure 2:
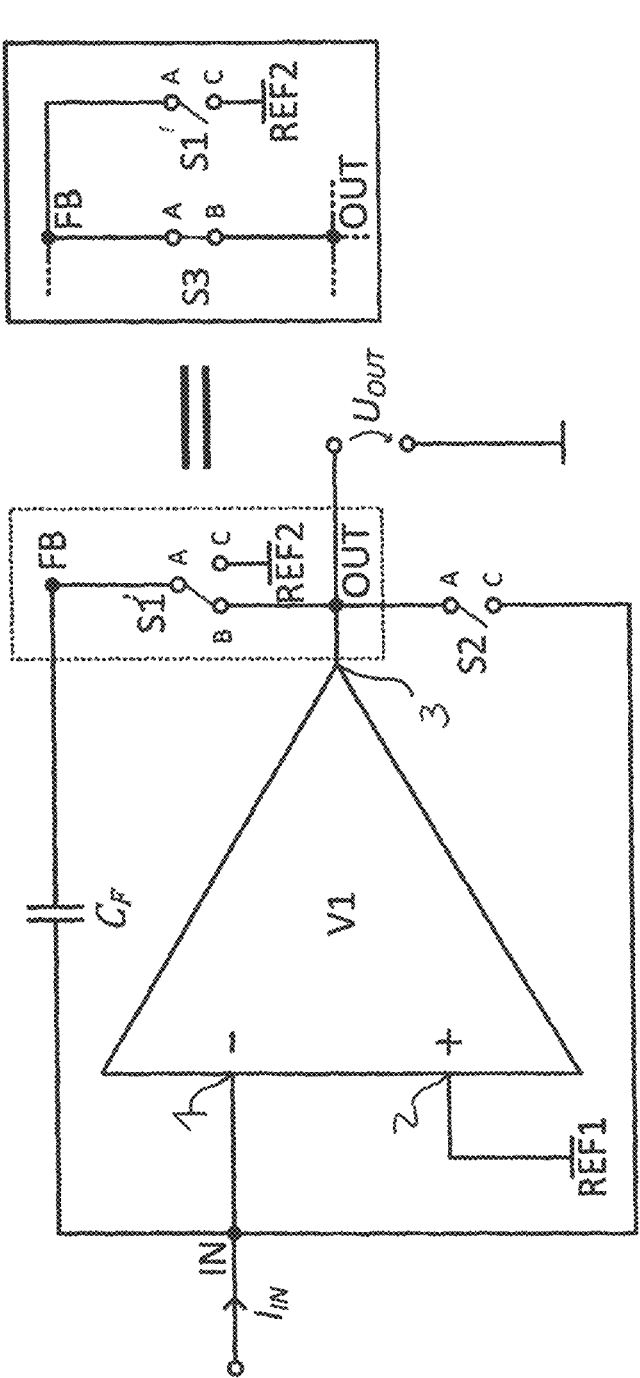

FIG. 2 shows an exemplary embodiment in which a capacitor $C_F$ is used as a feed-back element RE and a switch S3, which switches in the opposite direction to S1 and connects the contacts A and B, is used as a feedback control element. The on/off switches S1 and S3 were advantageously combined to form a changeover switch S1'.

FIG. 2 shows the circuit in a first operation mode in which the normal measurement and amplification function of the transimpedance amplifier stage can be carried out. In the first operation mode, a connection is established between an output connection 3 and the second connection of the feedback element $C_F$ via the first switch S1'. The second switch S2' disconnects the output connection 3 from the negative input connection 1. In this state, the circuit can be operated as a normal capacitive transimpedance amplifier stage, for example. The current $I_{IN}$ supplied at the input side is converted into a multiple amplified or integrated output signal $U_{OUT}$ via the transimpedance amplifier stage. Depending on the input signal, it may be necessary to discharge the feedback element $C_F$ in order to avoid disruptive effects if the maximum permissible voltage at the feedback element $C_F$ is reached as a result of the integrating function. For this purpose, the circuit is set to a second operation mode, which is represented in FIG. 3.

In comparison to FIG. 2, in the second operation mode, the first and the second switch S1', S2' are switched. The second connection of the feedback element $C_F$ is now connected to the contact C via the first switch S1' and thus to the second reference potential which is connected there. Via the second switch S2', a connection is established between the output connection 3 and the negative input connection 1 and thus also with the first connection of the feedback element $C_F$. In this state, the feedback element $C_F$ is rapidly discharged or charged by the signal amplifier V1 to a voltage which corresponds to the potential difference between the second reference potential at the contact C of the first switch S1' and the first reference potential at the positive input connection 2. If the voltage difference between these voltage potentials is equal to zero, the feedback element $C_F$ is thus completely discharged.

Figure 3:
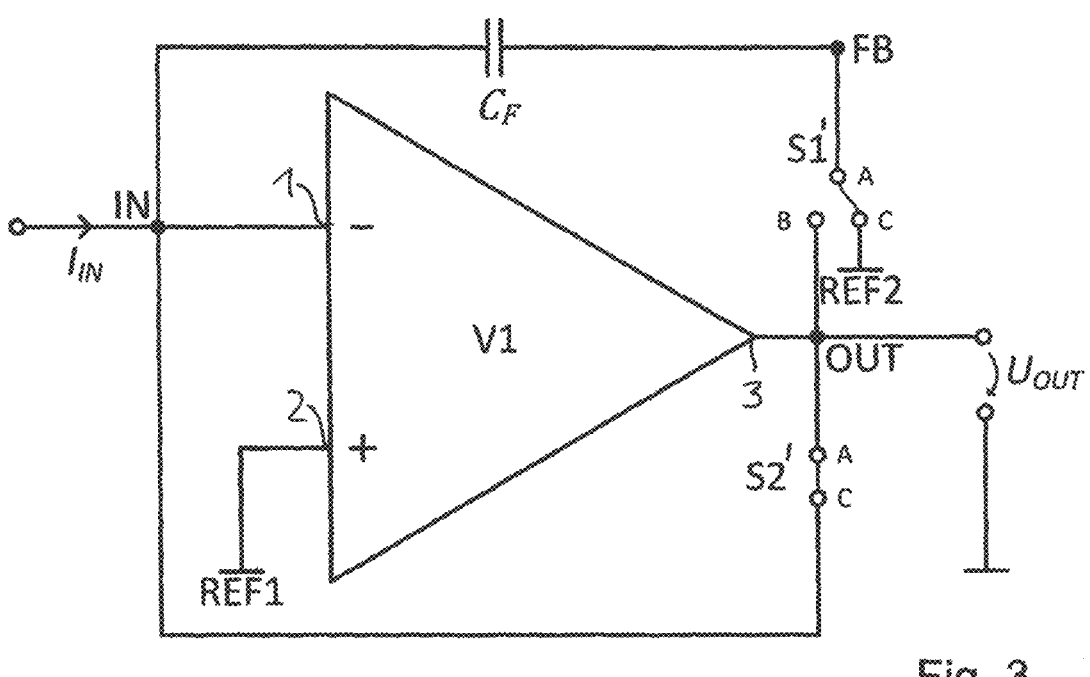
Figure 4:
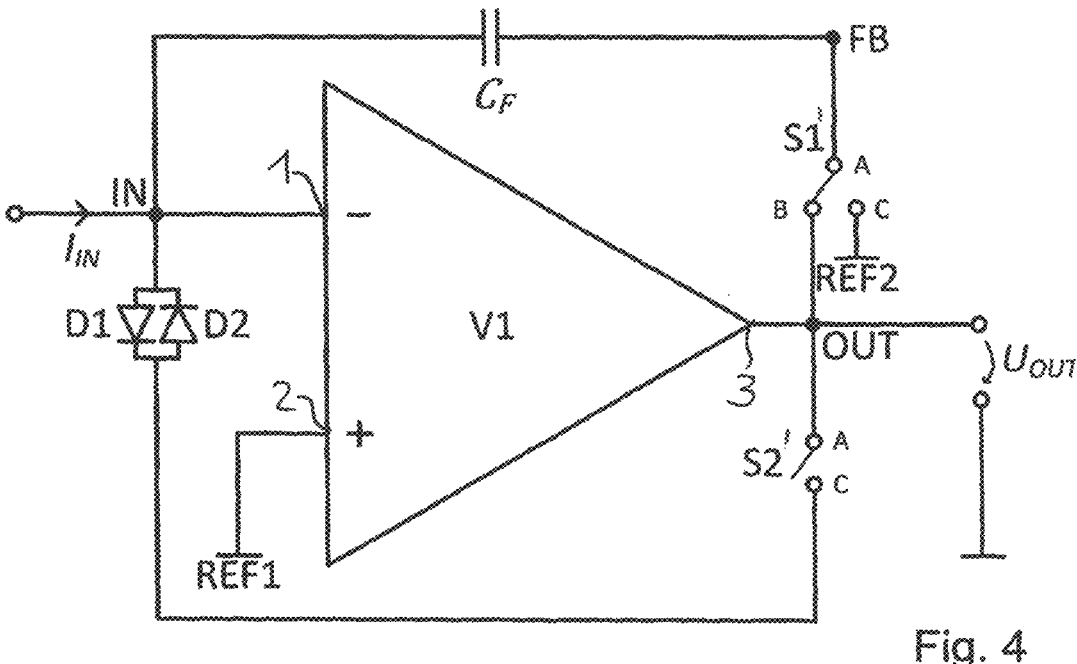
Figure 5:
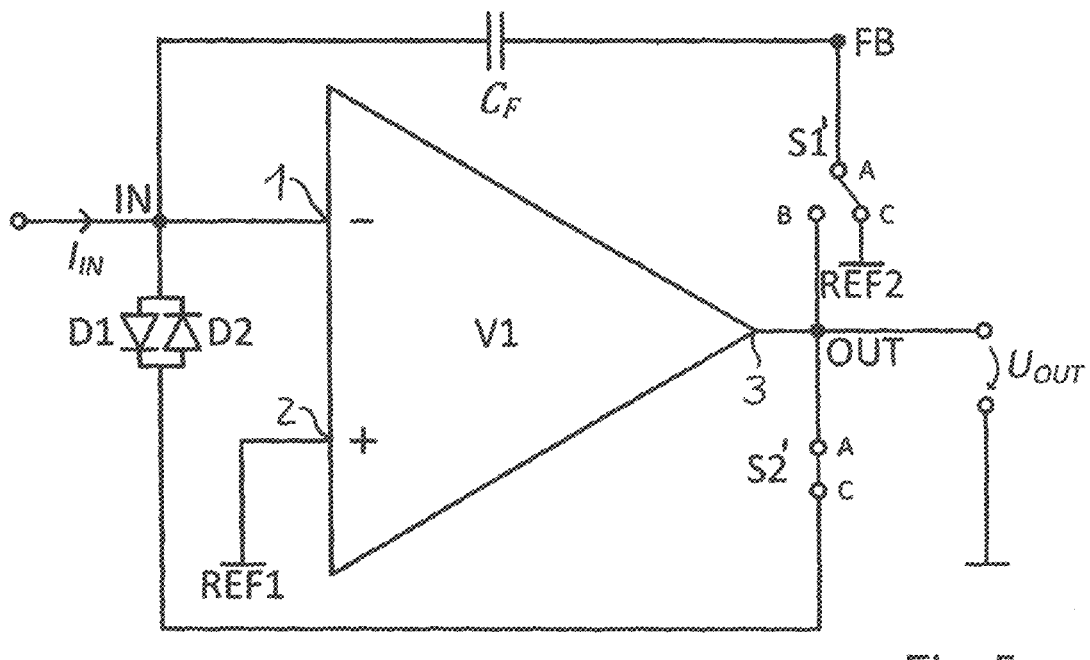

FIGS. 4 and 5 show an embodiment of the circuit which differs from FIGS. 2 and 3 in such a way that a current limiting element D1, D2 is connected in series in the connection from the output connection 3 via the second switch S2' to the negative input connection 1. The current limiting element D1, D2 can be designed as two diodes connected in antiparallel. This can further minimize interference effects through leakage currents and/or charge injections as a result of the first and the second switch S1', S2'. Moreover, FIG. 4 shows the circuit in the first operation mode, FIG. 5 shows the circuit in the second operation mode. The mode of operation otherwise corresponds to the mode of operation of the circuit in FIGS. 2 and 3.

Figure 6:
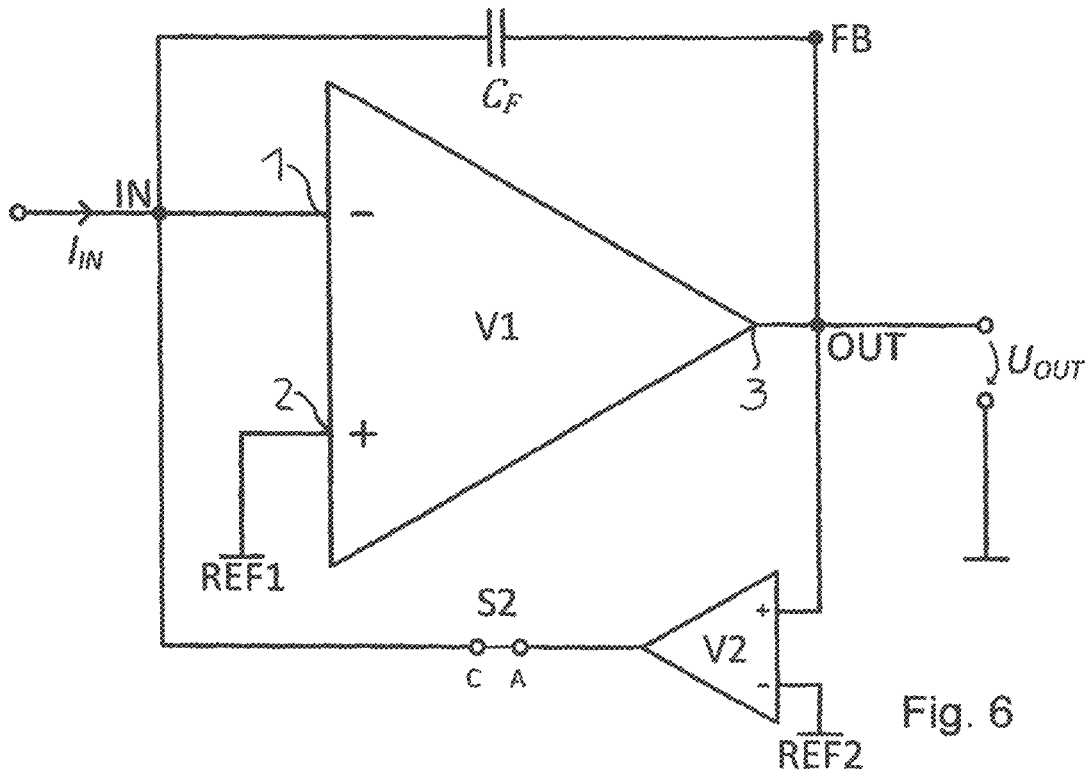

FIG. 6 shows a further variant of the circuit in which the feedback control element RSE has been replaced by a short circuit and the therefore superfluous switch S1' removed. The second connection of the feedback element RE, in this case, the capacitor $C_F$, is therefore directly connected to the output node OUT. Since the output of the signal amplifier V1 is not permanently connected to the second connection of the feedback element it can no longer perform the regulating function according to the invention. In order to still be able to provide the regulating function according to the invention, a second signal amplifier V2 is connected to the output node with its positive input, to the second reference potential with its negative input and to the contact A of the switch S2' with its output. This also tends to minimize the potential difference between its inputs and thus drives a current into the input node until the potential at the second connection of the feedback element corresponds to the second reference potential.

Figures 7, 8:
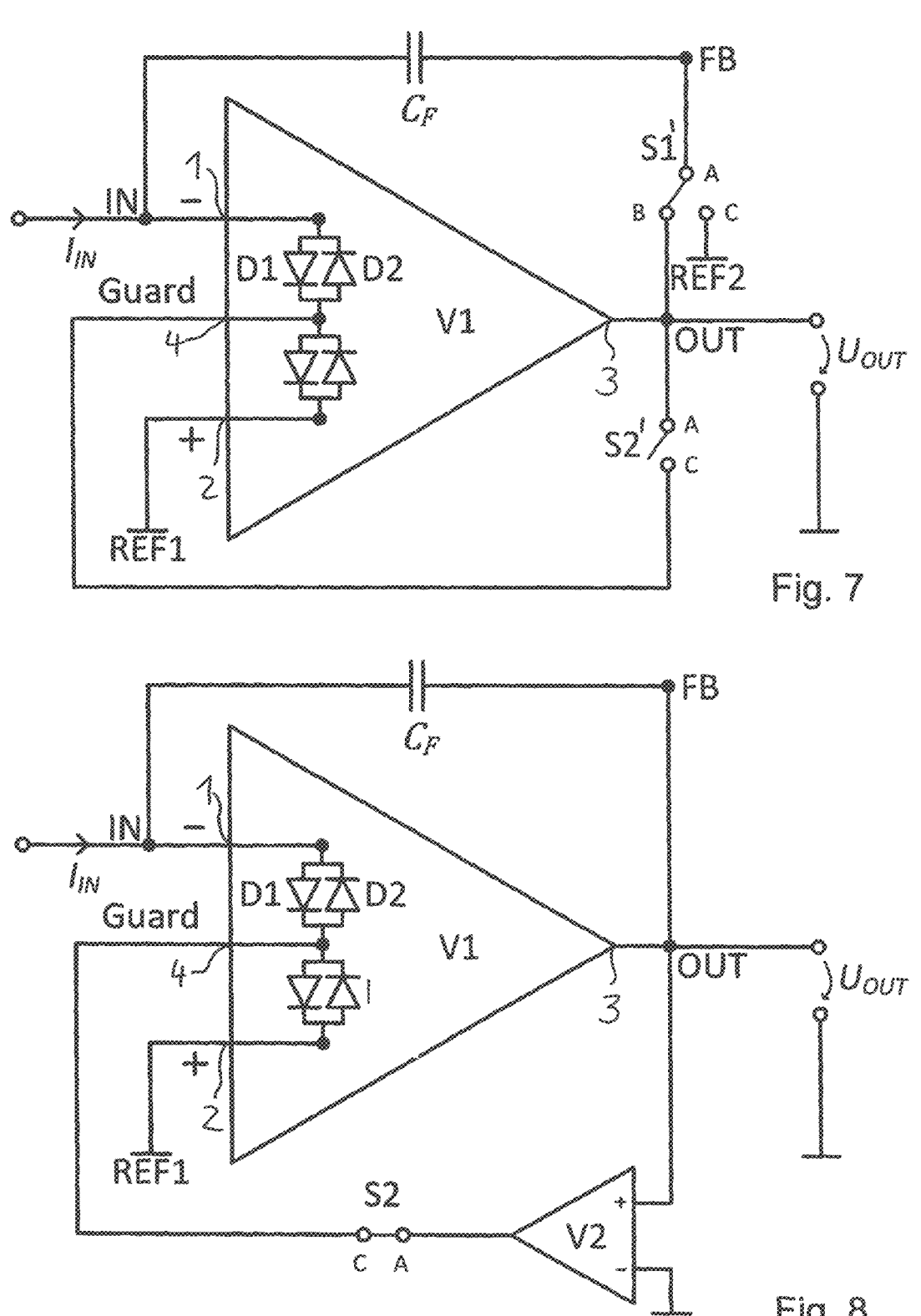

FIG. 7 shows an embodiment of the circuit which, like the embodiment in FIGS. 4 and 5, has a current limiting element D1, D2 in series with the second switch S2'. However, the current limiting element D1, D2 is not realized by an external diode circuit in this case, but rather by protection diodes integrated in the signal amplifier V1. A guard connection 4 of the signal amplifier V1 can be used for this purpose, for example. The second switch S2' is then simply connected to the guard connection 4. As a result of the internal wiring of the signal amplifier V1, the connection via the current limiting element D1, D2 to the negative input connection 1 is therefore already established.

FIG. 8 shows the circuit known from FIG. 6, likewise using a current limiting element realized via protection diodes D1, D2 integrated in the signal amplifier V1.

The invention claimed is:

1. An electrical circuit configured as a transimpedance amplifier stage, comprising:
    an input node,
    an output node,
    a feedback node,
    at least one signal amplifier comprising at least one output connection, and at least one input connection or at least one pair of differential input connections, wherein the an input signal applied to the at least one input connection or the at least one pair of differential input connections is converted into a multiple amplified output signal emitted at the at least one output connection, wherein the at least one output connection is connected or is connectable to the output node directly or via at least one further component, and wherein at least one of the at least one input connection or the at least one pair of differential input connections is connected to or is connectable to the input node directly or via at least one further component, wherein, in a case of an individual input connection of the at least one input connection a reference potential of a signal amplifier or, in a case of a pair of differential input connections of the at least one pair of differential input connections, the potential of an other input connection which is not connected or cannot be connected to the input node is a first reference potential,
    at least one feedback element connected to or connectable to the input node with a first connection directly or via at least one further component and to the feedback node with a second connection directly or via at least one further component,
    at least one feedback control element connected to or connectable to the feedback node with a first connection directly or via at least one further component and to the output node with a second connection directly or via at least one further component, at least one first switch through which the feedback node is connectable to a second reference potential directly or via at least one further component, at least one second switch through which the output node is connectable to the input node directly or via at least one further component, at least one current limiting component connected in series to the at least one second switch, wherein the at least one current limiting component has a current transfer characteristic through which substantially no current flows when a voltage applied to the at least one current limiting component is small, but in a case of a larger voltage, a current flows which is larger by more than a ratio of the voltage and the larger voltage, whereby the at least one current limiting component minimizes interference effects of the at least one first switch and/or the at least one second switch, wherein the at least one first switch and/or the at least one second switch are controllable by electrical control signals, wherein the electrical circuit has a control device for controlling the switching of the at least one first switch and/or the at least one second switch, wherein the control device is configured in a first operating mode for switching the at least one first switch and/or the at least one second switch into switching positions in which an input current flowing into the input node is converted into an amplified, integrated or other dependent output voltage signal at the output node of the electrical circuit, and wherein the control device is configured in a second operating mode for switching the at least one first switch and/or the at least one second switch to switching positions by which the feedback element is actively controlled to a neutral state, wherein the at least one signal amplifier compensates for voltage drops at the at least one first switch and/or the at least one second switch and other components located in a discharge path during the second operating mode by a high amplification factor of the at least one signal amplifier, and wherein the electrical circuit is operated in the first operating mode more than in the second operating mode.

2. The electrical circuit as claimed in claim 1, wherein the feedback control element is formed by a resistor, a capacitor, or a circuit arrangement made up of one or a plurality of resistors and/or one or a plurality of capacitors.

3. An electrical circuit configured as a transimpedance amplifier stage, comprising:

an input node, an output node, at least one signal amplifier which comprises at least one output connection and at least one input connection or at least one pair of differential input connections, wherein an input signal applied to the at least one input connection or the at least one pair of differential input connections is converted into a multiple amplified output signal emitted at the at least one output connection, wherein the at least one output connection is connected to or connectable to the output node directly or via at least one further component, and wherein the at least one input connection or the at least one pair of differential input connections is connected to or connectable to the input node directly or via at least one further component, wherein, in a case of an individual input connection of the at least one input connection a reference potential of a signal amplifier or, in a case of a pair of differential input connections of the at least one pair of differential input connections a potential of an other input connection which is not connected or cannot be connected to the input node is a first reference potential, at least one feedback element which is connected to or connectable to the input node with a first connection directly or via at least one further component, and is connected to or connectable to the output node with a second connection directly or via at least one further component, at least one further signal amplifier which comprises at least one further output connection and at least one further input connection or at least one further pair of differential input connections, wherein an input signal applied to the at least one further input connection is converted into a multiple amplified output signal emitted at the at least one further output connection, wherein the at least one further output connection is connected to a second switch directly or via at least one further component and at least one further input connection is connected to the output node directly or via at least one further component, wherein, in a case of an individual further input connection of the at least one further input connection, a reference potential of a further signal amplifier or, in a case of a further pair of differential input connections of the at least one pair of differential input connections, a potential of an other further input connection which is not connected or cannot be connected to the output node is referred to as a second reference potential, at least one second switch through which the further output connection is connectable to the input node directly or via at least one further component, at least one current limiting component connected in series to the at least one second switch, wherein the at least one current limiting component has a current transfer characteristic through which substantially no current flows when a voltage applied to the at least one current limiting component is small, but in a case of a larger voltage, a current flows which is larger by more than a ratio of the voltage and the larger voltage, whereby the at least one current limiting component minimizes interference effects of at least one first switch and/or the at least one second switch, wherein the at least one second switch is controllable by electrical control signals, wherein the electrical circuit has a control device for controlling the switching of the at least one second switch, wherein the control device is configured in a first operating mode for switching the at least one second switch into a switching position in which an input current flowing into the input node is converted into an amplified, integrated or other dependent output signal voltage at the output node of the electrical circuit, and wherein the control device is configured in a second operating mode for switching the at least one second switch to a switching position by which the feedback element is actively controlled to a neutral state, wherein the at least one signal amplifier compensates for voltage drops at the at least one second switch and other components located in a discharge path during the second operating mode by a high amplification factor of the at least one signal amplifier, and wherein the electrical circuit is operated in the first operating mode more than in the second operating mode.

4. The electrical circuit as claimed in claim 3 wherein the second reference potential corresponds to the first reference potential.

5. The electrical circuit as claimed in claim 1, wherein the control device is set up to switch the first and the second switch in a same direction.

6. The electrical circuit as claimed in claim 1 wherein the feedback control element is designed as a third switch which is switched by the control device in an opposite direction to the first switch, wherein the first and the third switch are designed as individual switches or as a common changeover switch.

7. A method for operating a circuit as claimed in claim 1 wherein the feedback element is reset to a neutral state by actively regulating a voltage across the feedback element to a specific value.

8. The method as claimed in claim 7, wherein in a first operation mode of the electrical circuit, a current flowing into the input node is converted into an amplified, integrated or otherwise dependent output signal at the output node of the electrical circuit, and in a second operation mode of the electrical circuit, the electrical circuit is actively regulated to a neutral state, wherein the first and the second operation mode are switchable.

9. The method as claimed in claim 7 wherein the feedback element is formed by a resistor, or a circuit arrangement made up of a plurality of resistors.

10. The electrical circuit as claimed in claim 1, wherein the at least one current limiting component is formed by input protection diodes integrated in a signal amplifier.

11. The electrical circuit as claimed in claim 1 wherein the output node is coupled with a differentiator.

12. The electrical circuit as claimed in claim 1 wherein the second reference potential corresponds to the first reference potential.

13. The method as claimed in claim 7 wherein the feedback element is formed by a capacitor, or a circuit arrangement made up of a plurality of capacitors.

\* \* \* \* \*